US008543362B2

(12) United States Patent
Germann et al.

(10) Patent No.: US 8,543,362 B2
(45) Date of Patent: Sep. 24, 2013

(54) SYSTEM AND METHOD FOR CONFIGURING A SIMULATION MODEL UTILIZING A TOOL FOR AUTOMATIC INPUT/OUTPUT ASSIGNMENT

(75) Inventors: David Joachim Germann, North Vancouver (CA); Greg Stewart, North Vancouver (CA)

(73) Assignee: Honeywell International Inc., Morristown, NJ (US)

( * ) Notice: Subject to any disclaimer, the term of this patent is extended or adjusted under 35 U.S.C. 154(b) by 396 days.

(21) Appl. No.: 12/879,640

(22) Filed: Sep. 10, 2010

(65) Prior Publication Data

US 2012/0016647 A1    Jan. 19, 2012

Related U.S. Application Data

(60) Provisional application No. 61/364,466, filed on Jul. 15, 2010.

(51) Int. Cl.
*G06G 7/48* (2006.01)

(52) U.S. Cl.
USPC .............. 703/6; 703/7; 715/249; 715/763

(58) Field of Classification Search
None
See application file for complete search history.

(56) References Cited

U.S. PATENT DOCUMENTS

| 7,162,404 | B2 | 1/2007 | Hunt et al. | |
|---|---|---|---|---|
| 7,337,102 | B2 | 2/2008 | Mosterman | |
| 7,797,674 | B1 * | 9/2010 | Brewton et al. | 717/105 |
| 7,975,233 | B2 * | 7/2011 | Macklem et al. | 715/763 |
| 7,996,782 | B2 * | 8/2011 | Hayles et al. | 715/763 |
| 8,028,242 | B2 * | 9/2011 | Kodosky et al. | 715/763 |
| 8,046,202 | B1 * | 10/2011 | Yang et al. | 703/6 |
| 8,161,380 | B2 * | 4/2012 | Bar-Or et al. | 715/249 |
| 2005/0257195 | A1 | 11/2005 | Morrow et al. | |
| 2006/0064292 | A1 | 3/2006 | Clune | |
| 2007/0038416 | A1 | 2/2007 | Benayon et al. | |
| 2007/0277151 | A1 | 11/2007 | Brunel et al. | |
| 2008/0034299 | A1 * | 2/2008 | Hayles et al. | 715/763 |
| 2008/0086705 | A1 | 4/2008 | Balasubramanian et al. | |

OTHER PUBLICATIONS

Palnithkar Verilog HDL A Guide to Digital Design and Synthesis, Sunsoft Press A Prentice Hall Title 1996 Sun Micro Systems, ISBN 0-13-451675-3, pp. 52-58.*
Search Report for Corresponding Application No. 11172294.8-2224/2407902 Dated Jan. 20, 2012.
Michael Hainer, "Steps Towards an Optimization of the Dynamic Emission Behavior of IC Engines: Measurement Strategies-Modeling-Model Based Optimization," Small Engine Technology Conference, SETC Proceedings, XP002423890, pp. 1-10, Nov. 1, 2001.

(Continued)

*Primary Examiner* — Saif Alhija
*Assistant Examiner* — Cuong Luu
(74) *Attorney, Agent, or Firm* — Seager Tufte & Wickhem LLC

(57) ABSTRACT

A method and system for configuring a model of a process. A model of a process is provided, which follows a particular sequence. Such a model includes a plurality of component sub-models, wherein each component sub-model among the component sub-models includes one or more input variables and one or more output variables. Such a method and system also generally includes automatically assigning one or more output variables to one or more input variables based on information associated with the particular sequence of the process.

14 Claims, 12 Drawing Sheets

(56) References Cited

OTHER PUBLICATIONS

Peter Marenbach et al., "Signal Path-Oriented Approach for Generation of Dynamic Process Models," Gecco 1996, Proceedings of the First Annual Conference Genetic Programming, XP002666423, MIT Press Cambridge, MA, USA, ISBN:0-262-61127-9, pp. 327-332, 1996.

\* cited by examiner

SYSTEM AND METHOD FOR CONFIGURING A SIMULATION MODEL UTILIZING A TOOL FOR AUTOMATIC INPUT/OUTPUT ASSIGNMENT

CROSS-REFERENCE TO PROVISIONAL PATENT APPLICATION

This patent application claims priority under 35 U.S.C. §119(e) to U.S. Provisional Patent Application Ser. No. 61/364,466, entitled "System and Method for Configuring a Simulation Model Utilizing a Tool for Automatic Input/Output Assignment," which was filed on Jul. 15, 2010, the disclosure of which is incorporated herein by reference in its entirety.

TECHNICAL FIELD

Embodiments are generally related to the simulation of dynamic or static systems and processes composed of a number of component sub-models with input and output variables. Embodiments also relate in general to the field of computers and similar technologies and, in particular, to software utilized in this field. Embodiments are additionally related to methods for configuring a simulation model with respect to an engine, plant, and/or other processes and systems.

BACKGROUND OF THE INVENTION

Process engineering involves the design of a wide variety of processing plants and processes carried out therein. Such processes may include, for example, internal combustion engine, chemical, petrochemical, refining, pharmaceutical, polymer, plastics, and other processes. Such processes usually include a number of physical components. For example, FIGS. 1(a) and 1(b) illustrate typical engine configurations that include various components. As indicated in the example configuration of FIG. 1(a), an internal combustion engine system 100 is depicted, which can include physical components such as a compressor 102, a charge air cooler 104, an EGR cooler 108, an EGR valve 110, an engine 112, a turbine 114, a wastegate valve 116, a turbo-shaft 113, and so forth. The configuration depicted in FIG. 1(a) thus generally illustrates an example engine 112 with a number of components. FIG. 1(b), on the other hand, illustrates an engine system 101 that includes more components including compressors 102 and 103, turbines 114 and 105, heat exchangers 104 and 108, valves 110, 115, 116, and an internal combustion engine 117. The configurations depicted in FIGS. 1(a) and 1(b) thus indicate that processes (e.g., internal combustion engines) have a number of components that typically correspond to physical devices such as compressors, heat exchangers, etc.

In process engineering, a simulation model can be designed and implemented in order to study and analyze the behavior of such processes. Computational simulation models associated with a particular process, for example, can be constructed utilizing a mathematical sub-model representing each of the physical components. Each sub-model generally possesses a number of input variables and generates respective output variables as is shown schematically in the graphical diagram 130 shown in FIG. 2. Each of the input variables 132 (e.g., $u_1, u_2 \ldots u_n$) of the component sub-model 134 as depicted in the diagram 130 in FIG. 2 must be assigned to or associated with an output variable such as output variables 136 (e.g., $y_1 \ldots y_n$) from other component sub models in order to construct an overall model of the process such as, for example the systems 100 and 101 respective depicted in FIGS. 1(a) and 1(b).

FIG. 3 illustrates a high-level flow chart of operations of a prior art method 300 for configuring engine models. As indicated at block 302, a process layout such as the layouts/configurations shown in FIG. 1(a) or FIG. 1(b) can be utilized as a starting point of the procedure. Next, as depicted at block 304, a user can select required component sub-models from a component library. Thereafter, as depicted at block 306, a user manually assigns all input variables with output variables from other component sub-models. Next, as described at block 308, a user manually introduces overall model readouts and assigns them with specific output variables. Performing all these steps results in a configured simulation model as indicated at block 310.

Simulation models are generally implemented using graphical modeling tools or in lines of code. Depending on the implementation approach taken, the input and output variable assignment, as indicated in block 306 in FIG. 3, as well as the creation of overall model readouts, as depicted at block 308 of FIG. 3, can be carried out by creating graphical connections or using some form of pointers/tags. The difficulty in such an approach, however, is that such operations currently must be performed manually. Such a manual assignment of input/output variables and the creation of overall model readouts is labor-intensive, cumbersome, and error prone, even for models with low complexity. Additionally, faults can be easily introduced during the configuration process, resulting in the simulation model to crash or produce incorrect results.

Based on the foregoing, it is believed that a need exists for an improved system and method for configuring a simulation model. In particular, the assignment of input and output variables, as shown at block 306 of FIG. 3, and the creation of overall model readouts, as described at block 308 of FIG. 3, should preferably be automatic in order to avoid errors and decrease the configuration effort of simulation models. A system and method, which automates these configuration operations, is described in greater detail herein.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for a configuration method, system, and computer-usable medium of simulation models.

It is another aspect of the disclosed embodiments to provide for an improved tool for assigning input and output variables of component sub-models associated with a particular system or process.

The aforementioned aspects and other objectives and advantages can now be achieved as described herein. A method and system for configuring a model of a process is disclosed, which includes providing a model of a process that follows a particular sequence. Such a model includes a plurality of component sub-models, wherein each component sub-model among the component sub-models includes one or more input variables and one or more output variables. Such a method and system also generally include automatically assigning one or more input variables to one or more output variables based on information associated with the particular sequence of the process.

Additionally, a category and a search direction can be defined with respect to one or more of the input variables. The category can also be defined with respect to one or more of the output variables. A reference parameter can also be provided to connect one or more of the input variables to one or more of the output variables. In addition, each component sub-model can be configured to include one or more of the input variables and one or more of the output variables. Each component sub-model can also be embedded in a component block with one or more inport connectors and one or more outport connectors. Such inport and outport connectors generally connect the component block in the particular sequence of the process. Additionally, one or more of the output variables can be assigned to the one or more of the input variables closest within the particular sequence of the process to one or more of the input variables in the search direction and which contains the same category as the input variable(s). This connection of output to input variables is carried out by assigning the reference parameter of the output variable to the input variable.

An overall model readout can be automatically created by placing a readout block at a desired location in the particular sequence of the process and selecting a category of a readout signal to be readout. Also, relative to the readout block within the particular sequence of the process, the closest output variable which has the same category as that of the selected readout signal can be assigned to the overall model readout utilizing a connecting reference parameter.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

Figure 1A:
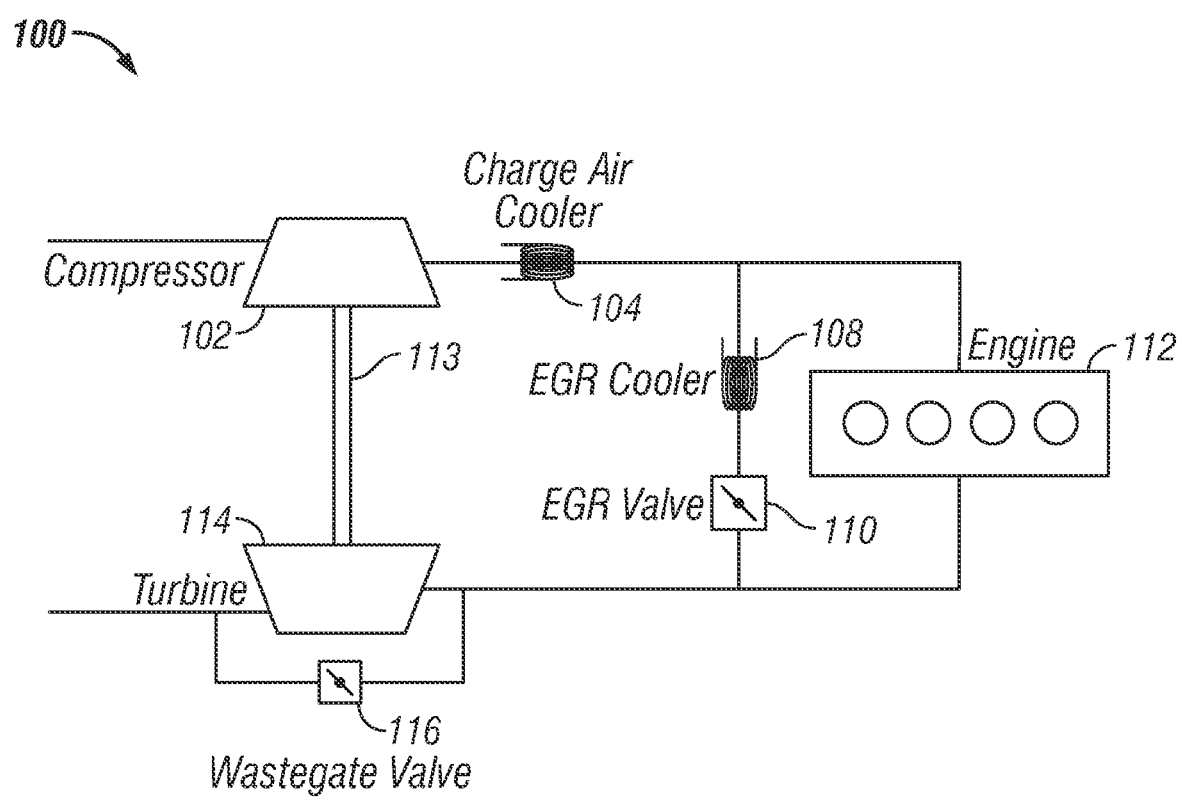
FIGS. 1(a) and 1(b) illustrate typical engine layouts that include various components.
Figure 1B:
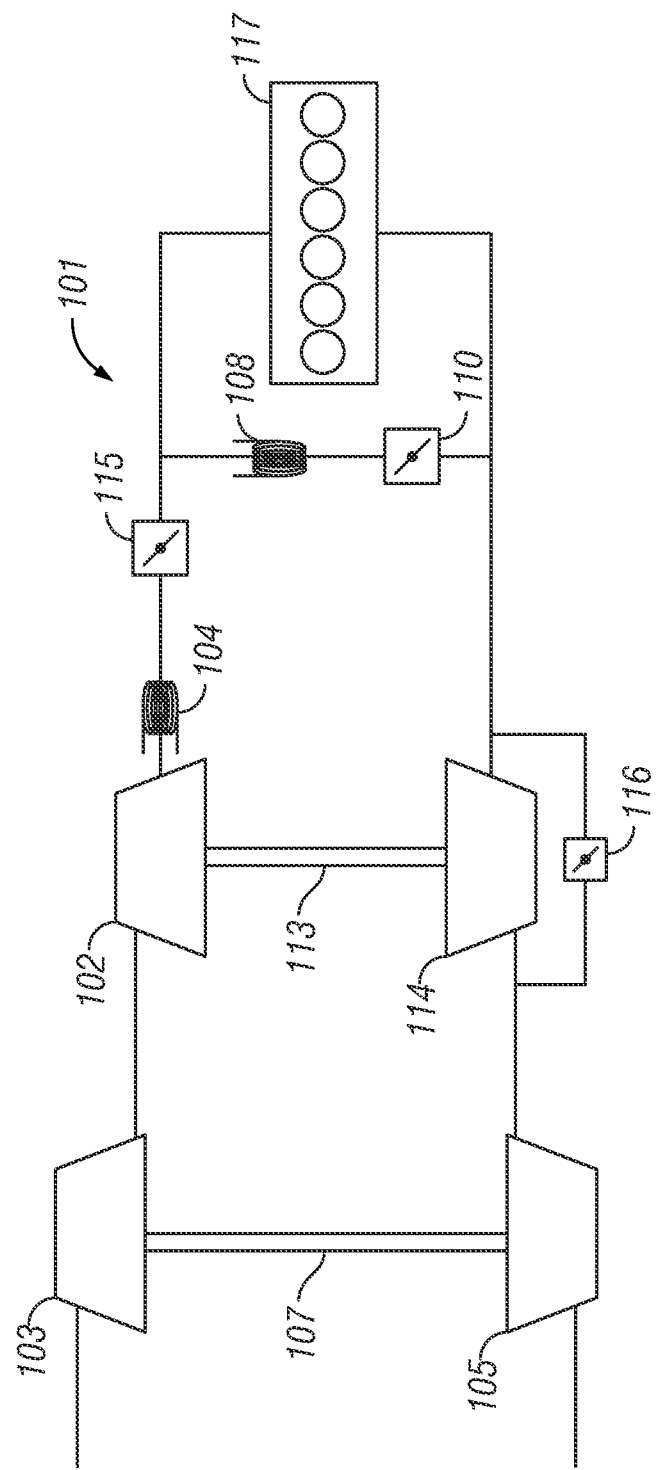
Figure 4:
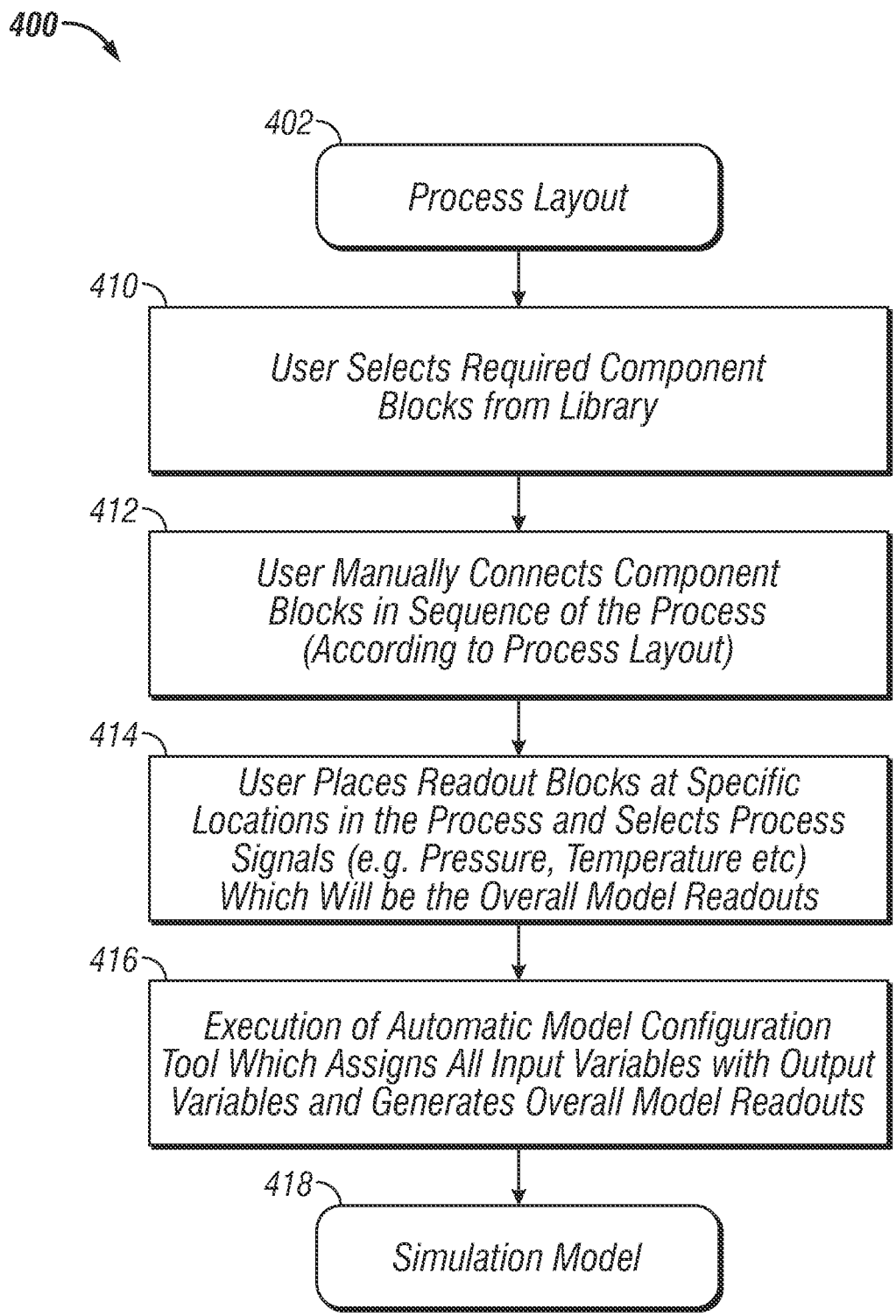
FIG. 4 illustrates a high-level flow chart of operations of an improved method 400 for configuring engine models, in accordance with the disclosed embodiments.

FIG. 4 illustrates a high-level flow chart of operations of an improved method 400 for configuring process models, in accordance with the disclosed embodiments. As indicated at block 402, a process layout such as, for example, the layouts/configurations depicted in FIG. 1(a) or 1(b) can be used as a starting point of the procedure. Thereafter, as illustrated at block 410, a user selects one or more required component blocks from a component library. Next, as depicted at block 412, a user can manually connect the component blocks in sequence of the process (i.e., according to the process layout). Thereafter, as described at block 414, the user can place one or more readout blocks at specific locations in the process and select process signals (e.g., pressure, temperature, etc.) which will be the over model readouts. Next, as shown at block 416, an automatic model configuration tool can be executed, which assigns all input variables with output variables and generates over model readouts. Performing all these steps can result in a configured simulation model, as indicated at block 418.

Figure 3:
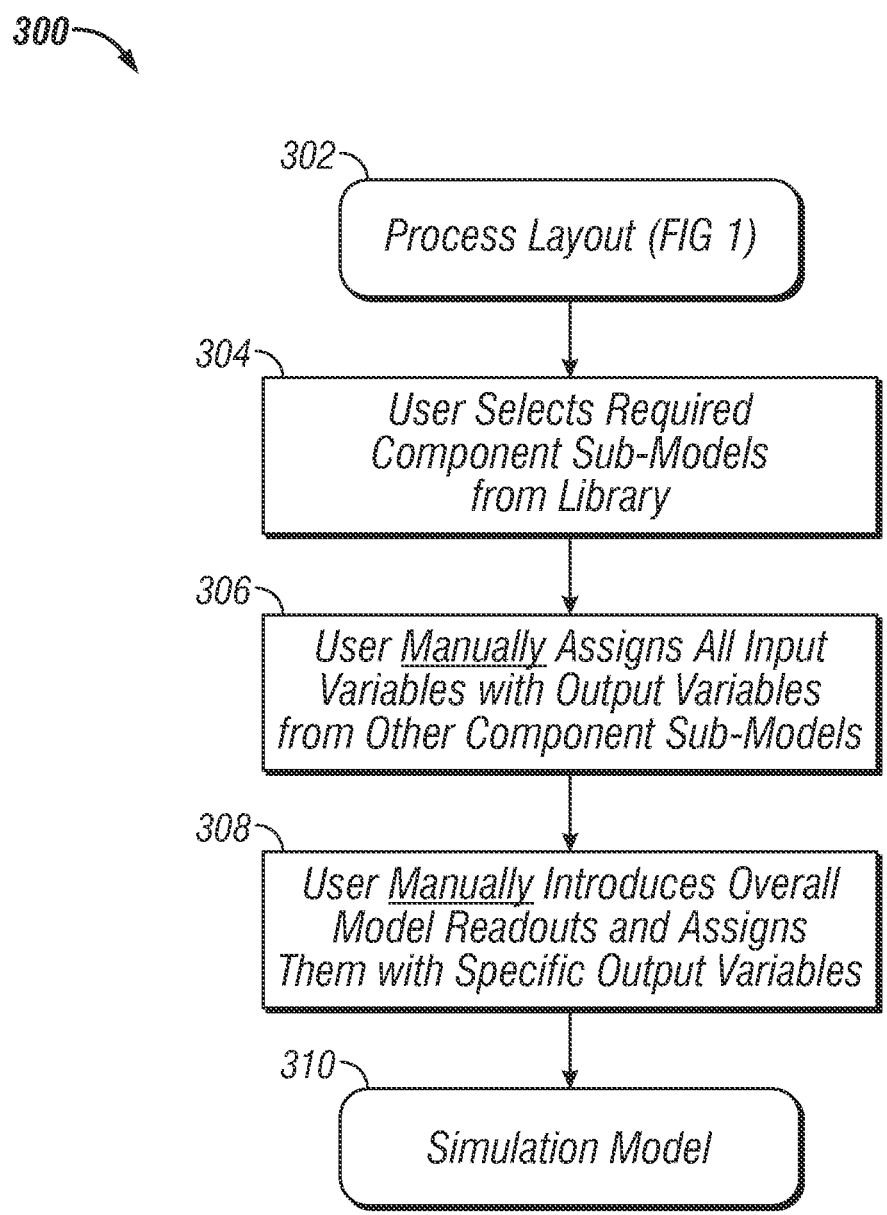
FIG. 3 illustrates a high-level flow chart of operations of a prior art method 300 for configuring process models.

Note that the steps indicated at blocks 414 and 416 are very different from those of in prior art approaches such as, for example, the approach of the method 300 of FIG. 3. While the method 300 depicted in FIG. 3 is manual, labor-intensive, and error prone, the method 400 is systematic, efficient, automated, and error free. In the prior art such as that depicted in FIG. 3, the user selected component sub-models from a component library and then manually configured the input/output variables. The outputs of the model were also created manually via the approach described earlier with respect to FIG. 3. With the methodology shown in FIG. 4, however, a user can select component blocks, which contain the component sub-models from a library and based on the process sequence according to which these component blocks are arranged the input/output variable assignment and creation of model readouts are automated. Thus, the method 400 is automatic, efficient, and error free.

Figure 2:
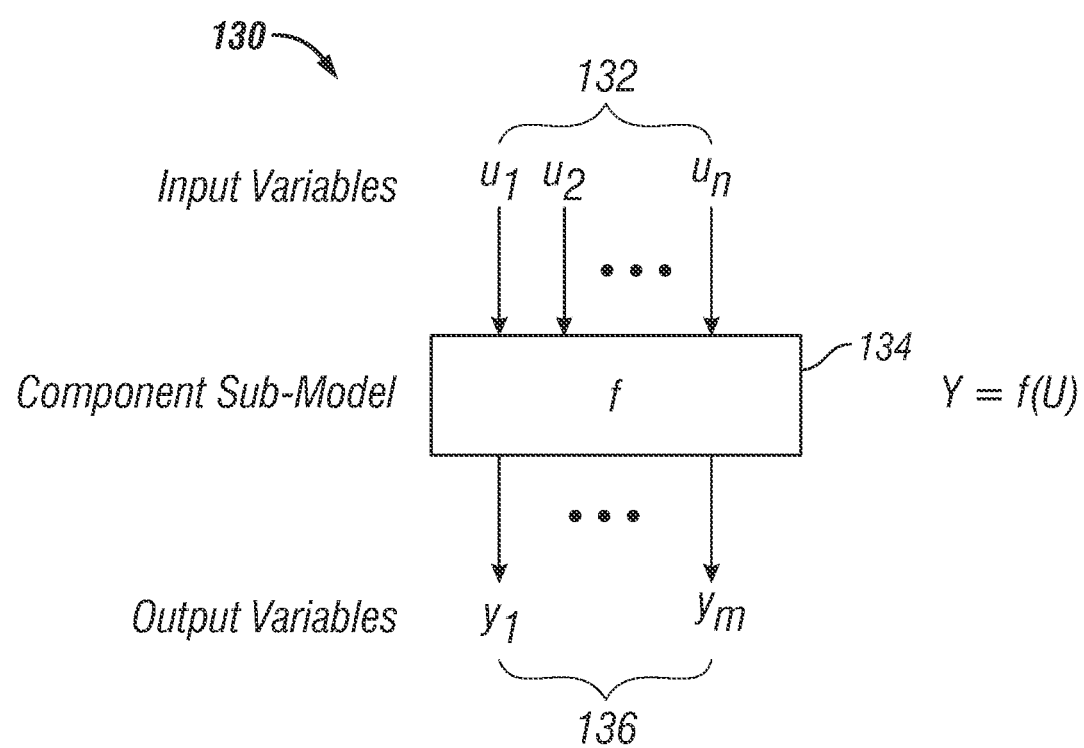
FIG. 2 illustrates a schematic diagram of a component sub-model with a number of input variables, which generates respective output variables.
Figure 5:
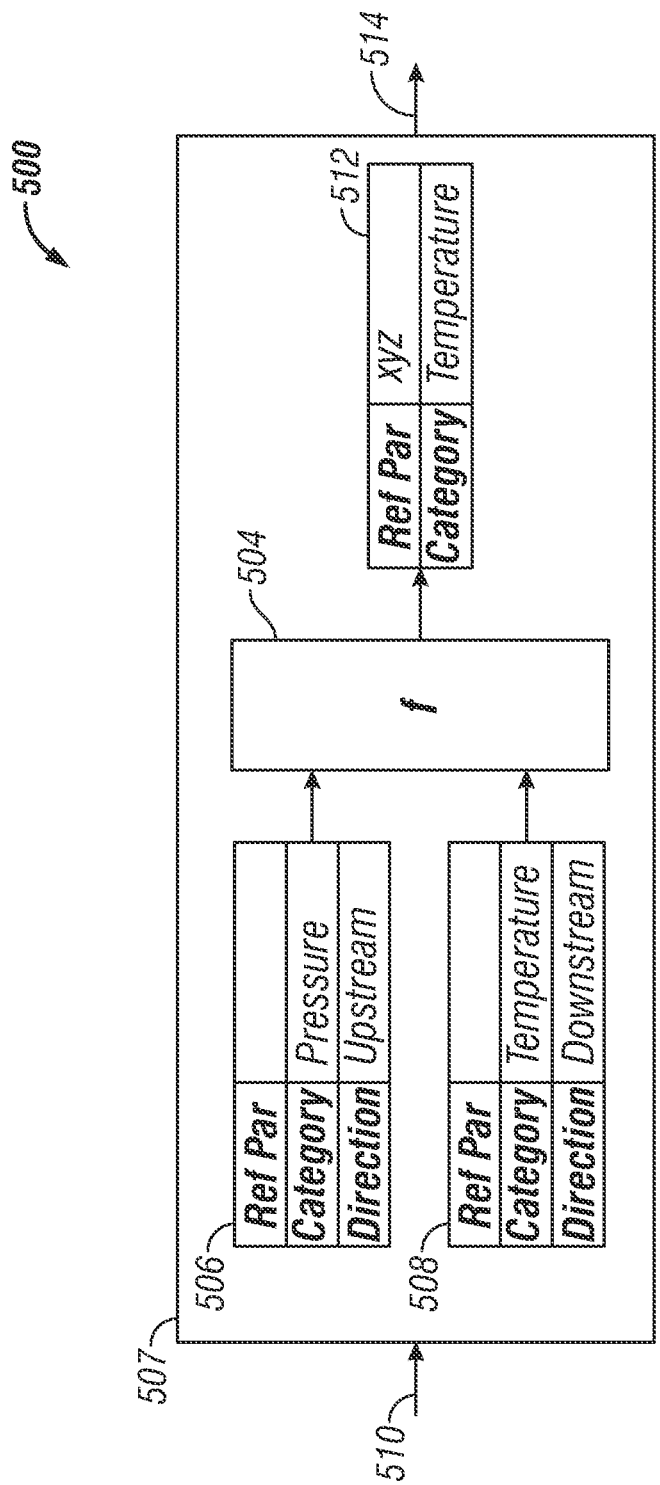
FIG. 5 illustrates a block diagram depicting the format of an example component block, in accordance with the disclosed embodiments.

FIG. 5 illustrates a block diagram depicting the format of an example component block 500, in accordance with the disclosed embodiments. As indicated in FIG. 5, the component block 500 generally includes an inport connector 510 and an outport connector 514. The component block 500 further includes a component sub-model 504, which is analogous to, for example, the component sub-model 134 shown in FIG. 2. Input variables 506 and 508 can be provided to the component sub-model 504, which in turn produces an output variable 512. The number of input and output variables depends on the type of component (e.g. compressor, valve, etc).

Each input variable such as, for example, input variables 506, 508, etc., can be assigned to or associated with a category (e.g., temperature, pressure, etc.) and a search direction (e.g., upstream or downstream of the process path), and a particular field can be provided to assign a connecting reference parameter (e.g., "ref par" in FIG. 5), which is shown as an empty field with respect to input variables 506 and 508. Every output variable such as, for example, output variable 512 shown in FIG. 5 is assigned to or associated with a category (e.g., temperature, pressure, etc.) and a unique connecting reference parameter such as, for example, "xyz" shown in FIG. 5. Each component sub-model such as, for example, component sub-model 504 and its input variables 506, 508, etc. and output variable(s) 512 are embedded in the component block 500 with the inport connector 510 and the outport connector 514.

It can be appreciated that the structure depicted in FIG. 5 is predefined in the component library and requires no user interaction. The structural definition (i.e. number of input and output variables and their categories etc.) is accomplished once during implementation of the component block by the developer. The user can then simply select predefined component blocks from the library and connects such predefined components in the sequence of the process through inport and outport connectors such as, for example inport connector 510 and outport connector 514.

Figure 6:
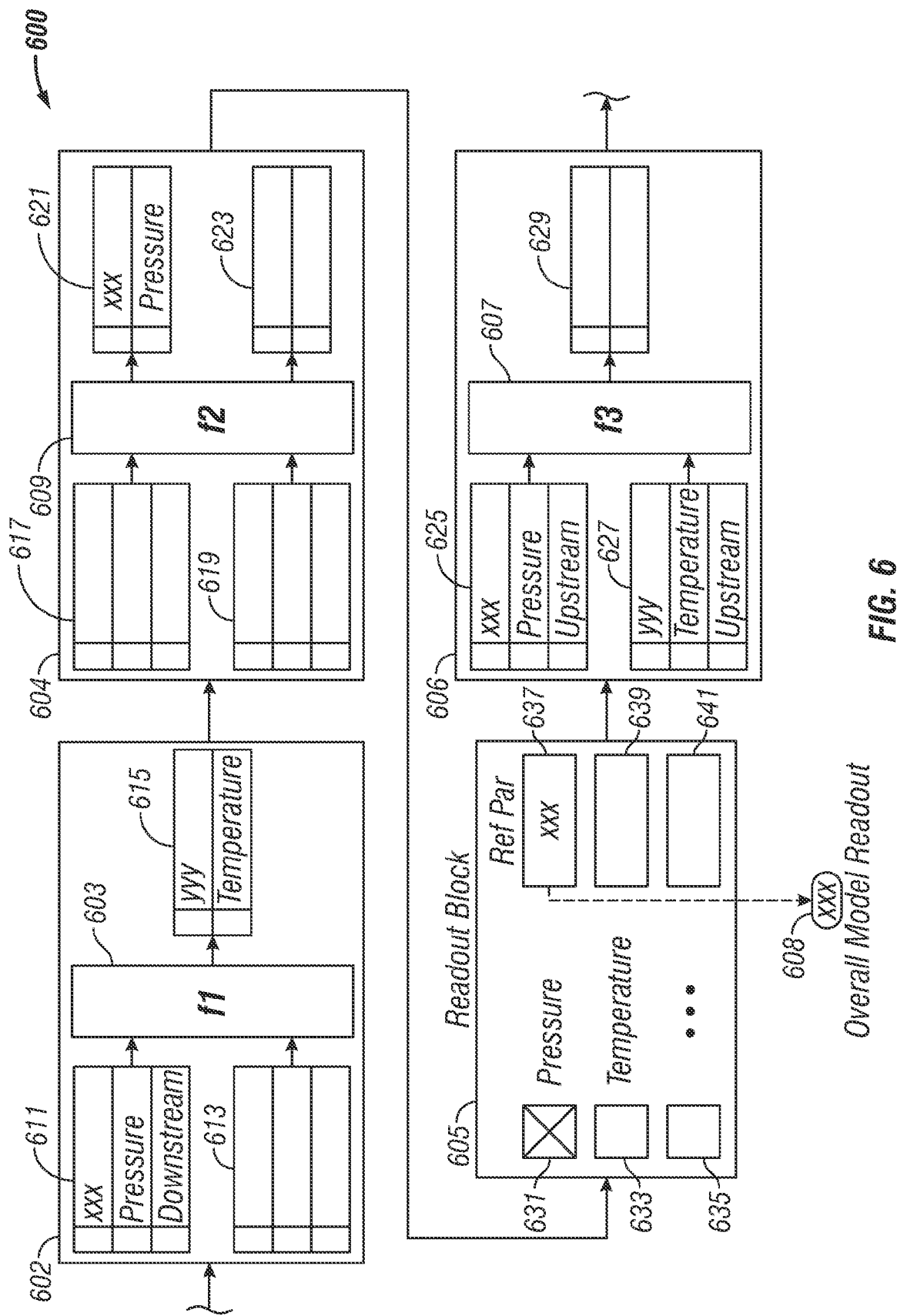
FIG. 6 illustrates a block diagram depicting an excerpt of a model example with three connected component blocks and a readout block, in accordance with the disclosed embodiments.

FIG. 6 depicts a diagram of a software topology 600, which allows for the automatic input and output assignments and the creation of readout signals, in accordance with the disclosed embodiments. The diagram depicted in FIG. 6 illustrates the structural preparations necessary so that the automated procedure described herein can be executed. In general, the diagram of the software topology 600 depicts an excerpt of an example process model with three connected component blocks 602, 604, and 606 and a readout block 605. Note that blocks 602, 604, and 606 shown in FIG. 6 are generally analogous or similar to the component block 500 shown in FIG. 5. In the example shown in FIG. 6, component block 602 includes input variables 611 and 613 to component sub-model 603. An output variable 615 output from component sub-model 603 is also shown in FIG. 6. Component block 604 includes input variables 617 and 619 to component sub-model 609 and output variables 621 and 623 thereof. That is, output variables 621 and 623 are shown in FIG. 6 just to the right of the component sub-model 609 and hence, are output from the component sub-model 609. Similarly, component block 606 includes input variables 625 and 627 to component sub-model 607 and output variable 629 thereof.

The overall approach described herein reads the category and search direction for every input variable in the process model. In the example of FIG. 6, the component block 602 contains the component sub-model 603 with an input variable 611 of the category "pressure" and search direction "downstream". The connecting reference parameter of the input variable 611 is not assigned and hence empty at the start of the input/output assignment. After determining the category and search direction, the algorithm automatically searches in the specified search direction (e.g. downstream for input variable 611) along the process path for an output variable of a matching category as the current input variable. For the example of input variable 611, the downstream search reaches component block 604 containing component sub-model 609 with output variable 621, which matches the category of input variable 611 (i.e. "pressure"). Once the matching output variable is found, the input and output variables are "connected" by assigning the unique connecting reference parameters of the output variable to the input variable. For the example of input variable 611, the connecting reference parameter "xxx" of output variable 621 is assigned.

Similar to input variable 611, the input variables 625 and 627 of component block 606 can be assigned with reference parameters. In this case, the search direction is upstream of the process path and input variable 625 is assigned with output variable 621 while input variable 627 and output variable 615 are connected. Once all the connecting reference parameters of the input variables have been automatically assigned, the overall model readout(s) (e.g. see overall model readout 608 in FIG. 6) can be automatically generated based on the user specifications.

The overall model readouts 608 can be specified by placing readout blocks such as the readout block 605 at particular locations in the process flow, where the user requires the model to provide readouts of certain process variables. In the example shown in FIG. 6, the readout block 605 includes boxes such as boxes 631, 633 and 635, which can be "checked" in order to set the readout of a process variable active by selecting a particular category. For example, the category associated with the box 631 is "pressure" and the category associated with box 633 is "temperature". In the example readout block 605 of FIG. 6, the category of "pressure" is shown as selected via the "checked" box 631. Readout block 605 also displays several fields 637, 639, and 641, which for every active readout signal contains the connecting reference parameter of corresponding output variables. These fields are initially empty.

For each active readout signal, the category is read. Note that in contrast to the automatic input/output assignment, the search direction where the matching output variable is located is not "a priori" known for the readout signals and is set to upstream per default. Similar to the input and output variable assignment, the disclosed approach automatically implements searching in this specified search direction along the process path for an output variable of the matching category as the readout signal. Once the output variable is found, its connecting reference parameter is read and an overall model readout is created to which this reference parameter is assigned. Once all active readout signals have been processed subsequently to having executed the input/output variable assignment, the model configuration is complete.

In the example readout block 605, the readout signal with category "pressure" is set active by checked box 631. As the search direction is upstream by default, the search reaches block component 604 containing component sub-model 609 with output variable 621. Output variable 621 matches the category of the active readout signal and hence its reference parameter "xxx" is assigned to the readout signal in box 637. Additionally, the overall model readout 608 is created and the reference parameter "xxx" is assigned.

Under certain conditions, the default search direction (e.g., upstream) may need to be reversed (e.g., set to downstream) in case it is determined that the required output variable is located downstream of the readout block such as readout block 605. (Note that the search direction is only reversed to downstream once and never back again (which is the default)). Such a situation can be detected if the upstream search, for example, arrives at a component block, which has an input variable that is assigned to the downstream output variable with the identical category as the readout signal.

Figure 7:
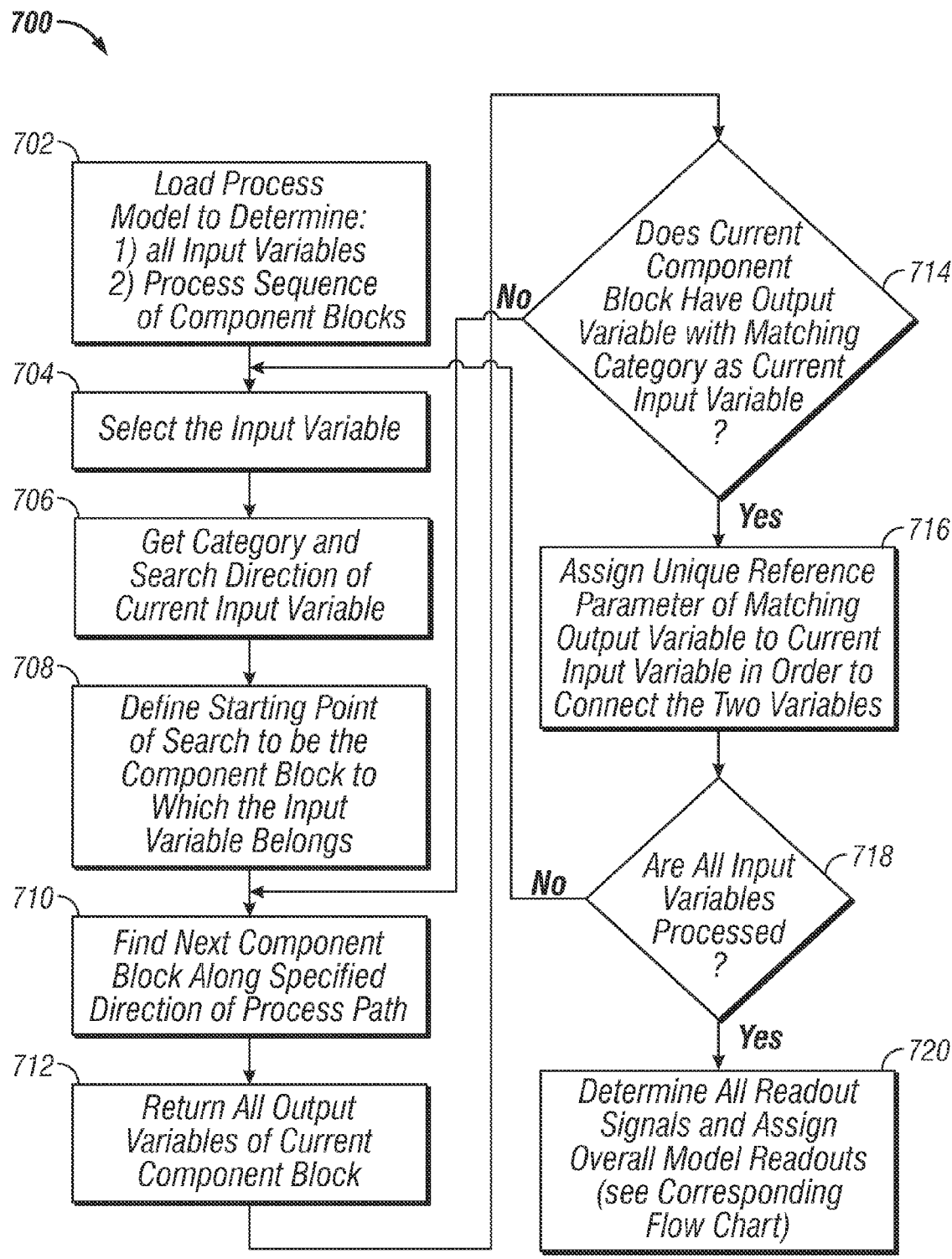
FIG. 7 illustrates a high-level flow chart of operations illustrating logical operational steps of a method for the automatic assignment of output variables to input variables, in accordance with the disclosed embodiments.

FIG. 7 illustrates a high-level flow chart of operations illustrating logical operational steps of a method 700 for the automatic assignment of output variables to input variables, in accordance with the disclosed embodiments. Thus, as indicated at block 702, a process model can be loaded to determine all input and output variables and the process sequence of the component blocks. Next, as illustrated at block 704, a loop over all input variables is initiated by selecting the next input variable. Thereafter, as described at block 706, an operation can be implemented to get the category and search direction of the current input variable. Then, as shown at block 708, the starting point of the search can be defined to be the component block to which the input variable belongs.

Thereafter, as described at block 710, an operation can be implemented to determine the next component block along the specified direction of the process path. Next, as depicted at block 712, all output variables of the current component block are returned. Then, as described at block 714, a test can be implemented to determine if the current component block has an output variable with the matching category as the current input variable. If the answer is "no", then the operations shown at block 710 and 712 are repeated and so on. If the answer is "yes", then as illustrated at block 716, the unique reference parameter of the matching output variable can be assigned to the current input variable in order to connect the two variables. Then, as indicated at block 718, a test can be performed to determine if all input variables have been processed. If the answer is "no", then the loop over all input variables continues with the operations as indicated at blocks 704, 706, and so forth. If the answer is "yes", then all readout signals are determined and overall model readouts assigned, as indicated at block 720. Note that block 720 also refers to the corresponding flow chart shown in FIG. 8 with respect to determining all readout signals and assigning overall model readouts.

Figure 8:
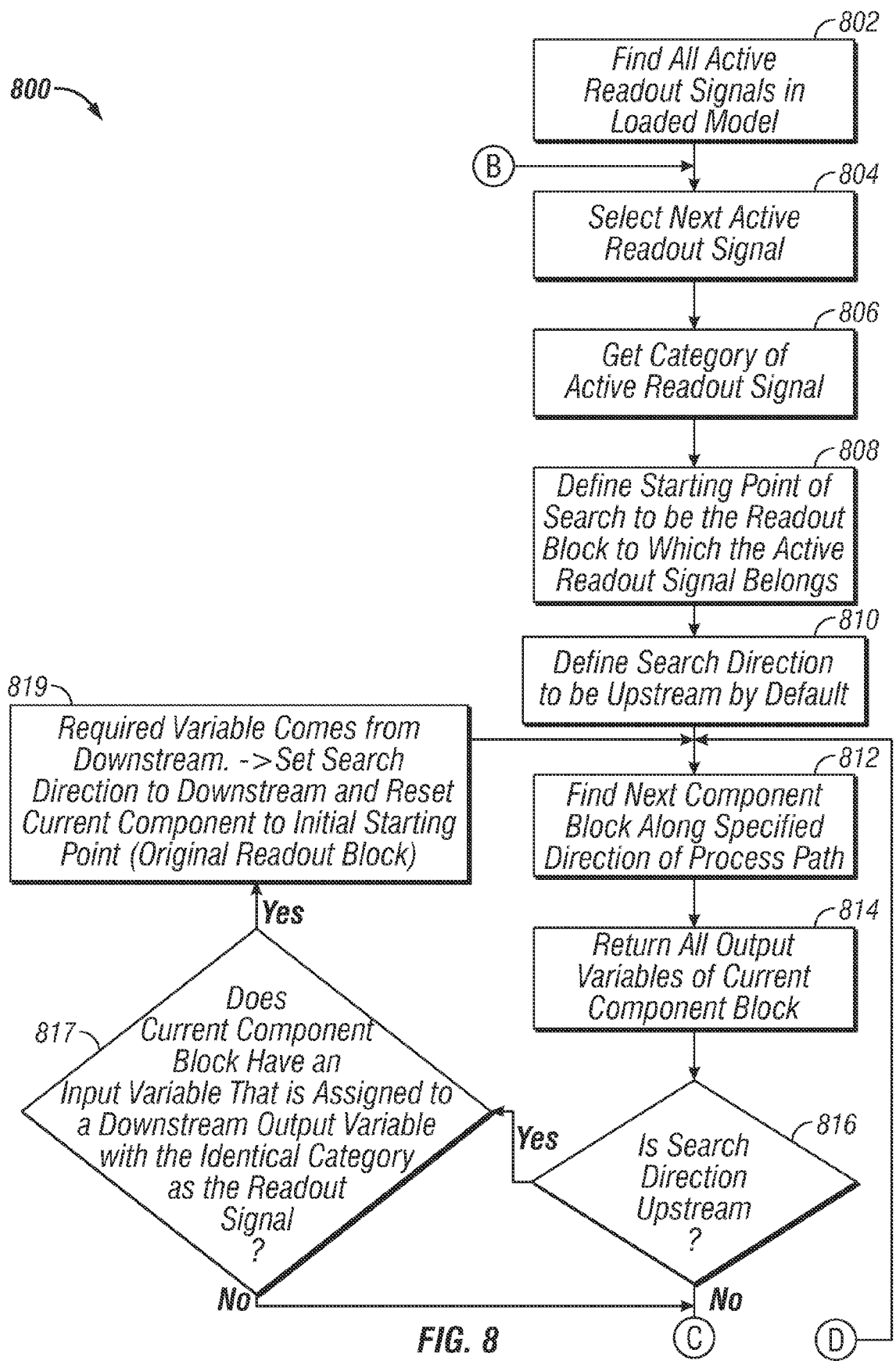
FIG. 8 illustrates a high-level flow chart of operations depicting logical operational steps of a method for creating overall model readouts, based on active readout signals specified by a user, in accordance with the disclosed embodiments.
Figure 8:
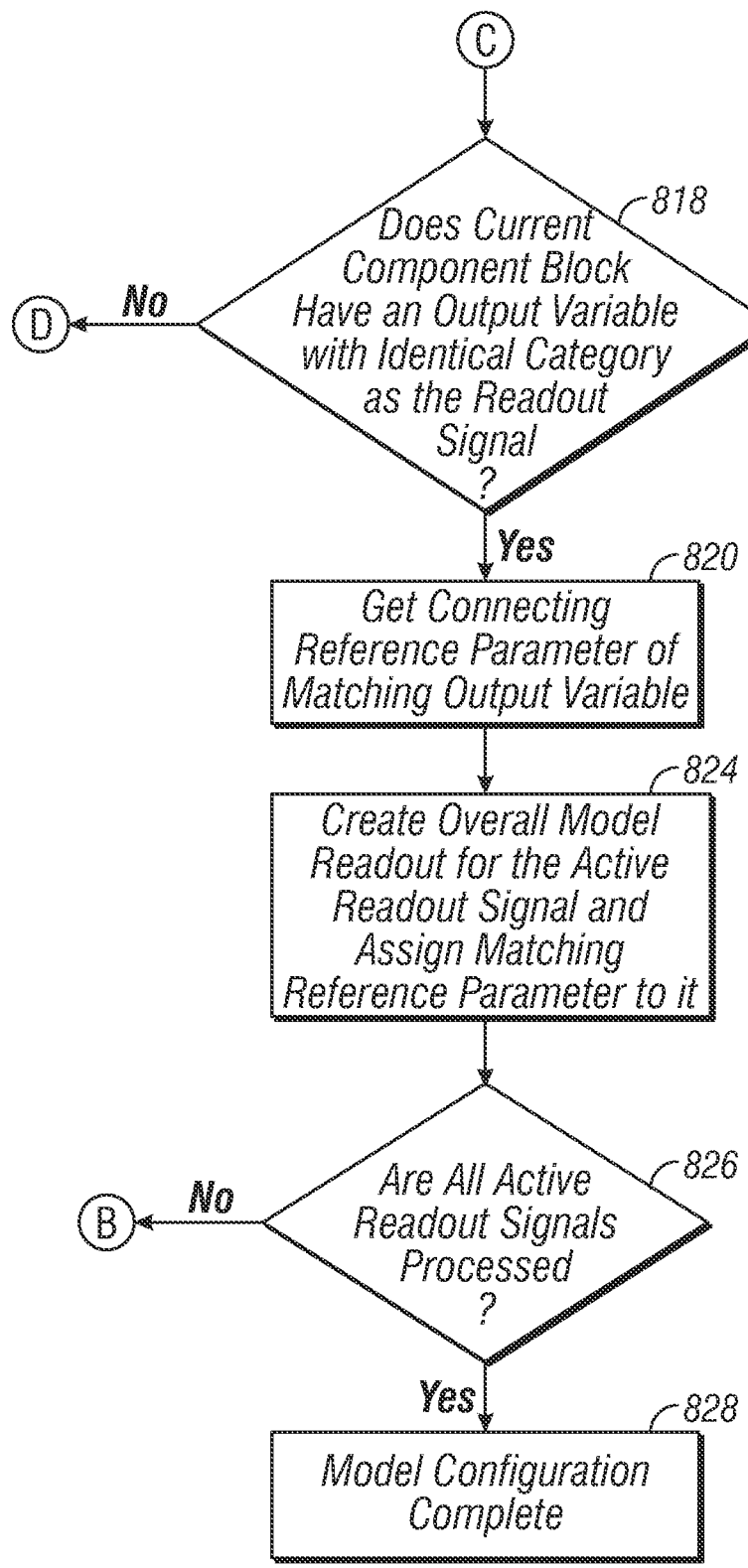

FIG. 8 illustrates a high-level flow chart of operations depicting logical operational steps of a method 800 for creating overall model readouts based on active readout signals specified by a user, in accordance with the disclosed embodiments. As indicated at block 802, an operation can be processed to determine all active readout signals in the loaded process model. Then, as depicted at block 804, a loop over all active readout signals can be initiated by selecting the next active readout signal. Thereafter, as illustrated at block 806, an operation can be implemented to get or retrieve the category of the active readout signal. Next, as shown at block 808, an operation can be processed to define the starting point of search to be the readout block to which the active signal belongs. Then, as described at block 810, an operation can be implemented to define the search direction to be "upstream" by default.

Next, as indicated at block 812, an operation can be implemented to determine the next component block along the specified direction of the process path. Thereafter, as illustrated at block 814, an operation can be implemented to return all output variables of the current component block. Then, as described at block 816, a test can be performed to determine if the search direction is upstream. If the answer is "yes", then the operation indicated at block 817 is implemented. If the answer is "no", then the operation depicted at block 818 can be implemented.

The operation illustrated at block 817 involves determining if the current component block has an input variable assigned to a downstream output variable with the identical category as the readout signal. If the answer is "yes", then the operation indicated at block 819 can be implemented. If the answer is "no", then the operation depicted at block 818 is processed. As indicated at block 819, once the required variable comes from the downstream direction, the search direction is set to "downstream" and the current component is reset to an initial starting point (i.e., original readout block).

The operation described at block 818 involves determining if the current component block has an output variable with an identical category as the readout signal. Assuming the answer is "no", then the operation indicated at block 812 is processed. Assuming the answer is "yes", then as depicted at block 820, an operation can be processed to get the connecting reference parameter of the matching output variable. Thereafter, as illustrated at block 824, the overall model readout for the active readout signal can be created and the matching reference parameter assigned to it. Then, as depicted at block 826, a test can be performed to determine if all active readout signals have been processed. If the answer is "no", then the loop over all active readout signals continues with operations beginning at block 804, 806, etc. If the answer is "yes", then as illustrated at block 828, the model configuration is completed.

Figure 9:
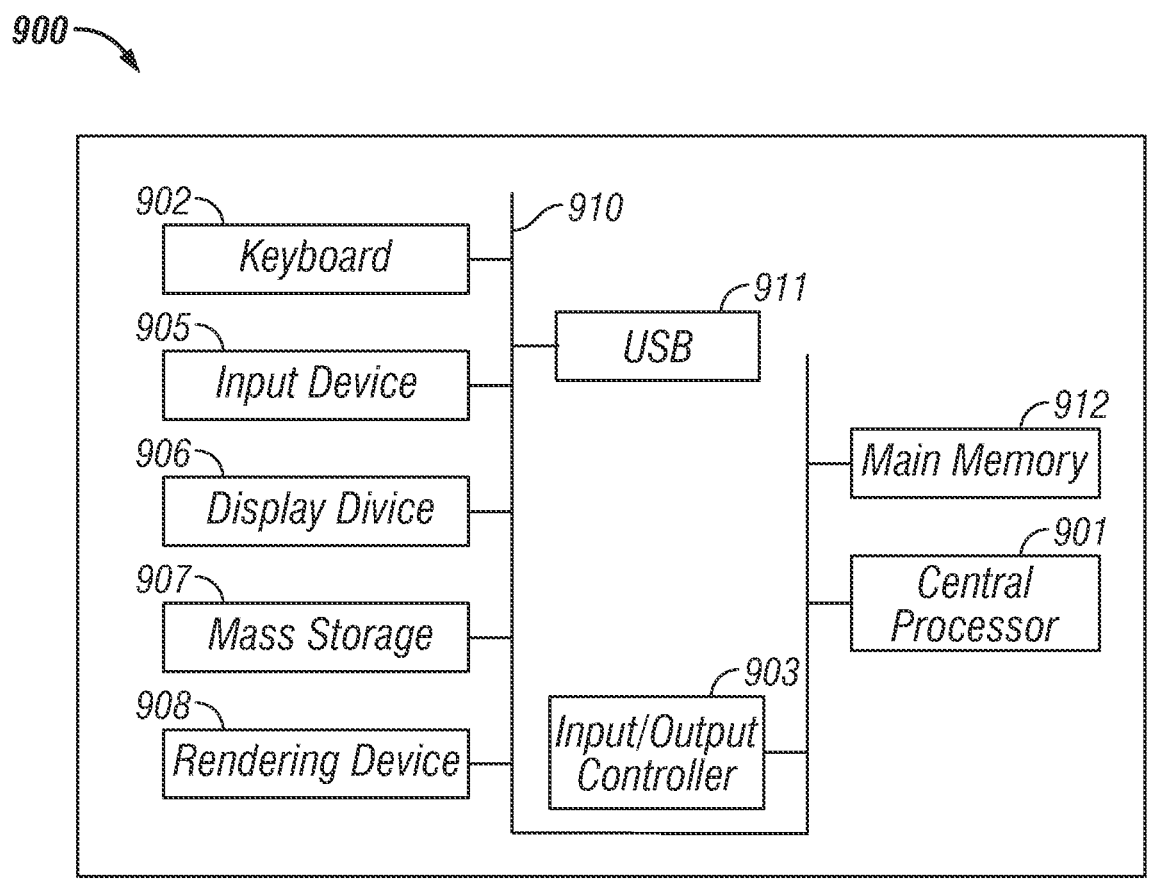
FIG. 9 illustrates a schematic view of a data-processing system in which an embodiment may be implemented.
Figure 10:
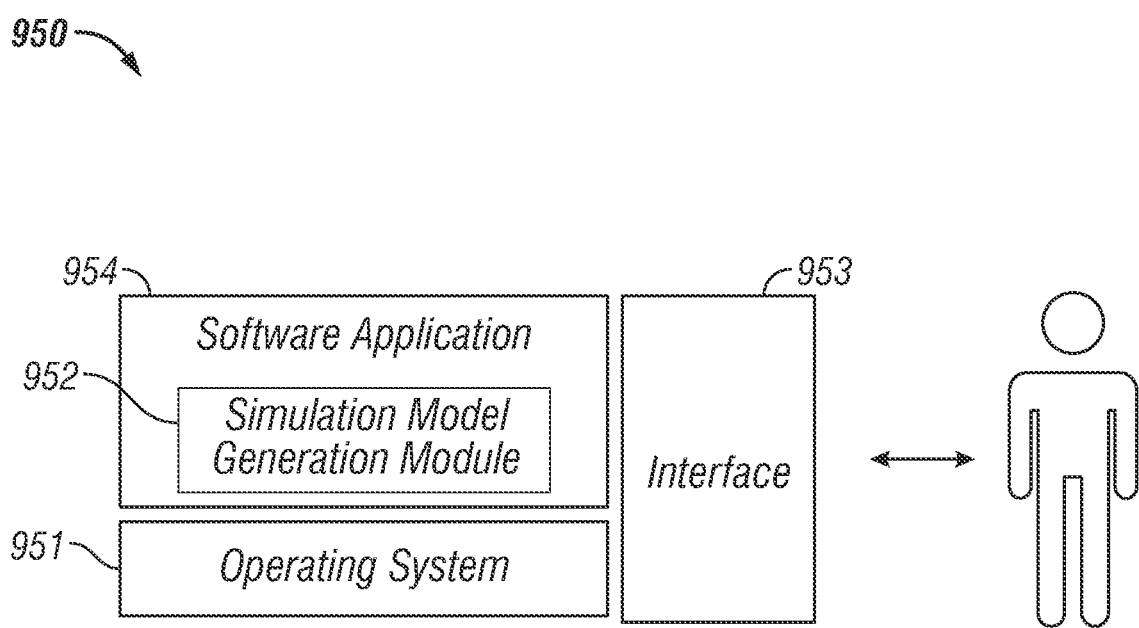
FIG. 10 illustrates a schematic view of a software system including a simulation model generation module, an operating system, an application software, and a user interface, which can be utilized for carrying out an embodiment.

FIGS. 9-10 are provided as exemplary diagrams of data-processing environments in which embodiments of the present invention may be implemented. It should be appreciated that FIGS. 9-10 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

As illustrated in FIG. 9, the disclosed embodiments may be implemented in the context of a data-processing system 900 that includes, for example, a central processor 901, a main memory 912, an input/output controller 903, a keyboard 902, an input device 905 (e.g., a pointing device such as a mouse, track ball, pen device, etc), a display device 906, a mass storage 907 (e.g., a hard disk), and a USB (Universal Serial Bus) peripheral connection 911. Additional input/output devices, such as a rendering device 908 (e.g., printer, scanner, fax machine, etc), for example, may be associated with the data-processing system 900 as desired. As illustrated, the various components of data-processing system 900 can communicate electronically through a system bus 910 or similar architecture. The system bus 910 may be, for example, a subsystem that transfers data between, for example, computer components within data-processing system 900 or to and from other data-processing devices, components, computers, etc.

FIG. 10 illustrates a computer software system 950 for directing the operation of the data-processing system 900 depicted in FIG. 9. Software application 954, stored in main memory 912 and on mass storage 907, generally includes a kernel or operating system 951 and a shell or interface 953. One or more application programs, such as software application 954, may be "loaded" (i.e., transferred from mass storage 907 into the main memory 912) for execution by the data-processing system 900. The data-processing system 900 receives user commands and data through user interface 953; these inputs may then be acted upon by the data-processing system 900 in accordance with instructions from operating system module 951 and/or software application 954.

The discussion herein is intended to provide a brief, general description of suitable computing environments in which the disclosed embodiments may be implemented. Although not required, the disclosed embodiments are described in the general context of computer-executable instructions, such as program modules, being executed by a single computer. In most instances, a "module" constitutes a software application.

Generally, program modules include, but are not limited to, routines, subroutines, software applications, programs, objects, components, data structures, etc., that perform particular tasks or implement particular abstract data types and instructions. Moreover, those skilled in the art will appreciate that the disclosed method and system may be practiced with other computer system configurations such as, for example, hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular abstract data type.

Modules may be composed of two parts: an interface, which lists the constants, data types, variable, and routines that can be accessed by other modules or routines; and an implementation, which is typically private (accessible only to that module) and which includes source code that actually implements the routines in the module. The term module may also simply refer to an application such as a computer program designed to assist in the performance of a specific task such as word processing, accounting, inventory management, etc.

The interface 953, which is preferably a graphical user interface (GUI), can serve to display results, whereupon a user may supply additional inputs or terminate a particular session. In some embodiments, operating system 951 and interface 953 can be implemented in the context of a "Windows" system such as that offered via a Mac personal computer or a Microsoft Windows environment. It can be appreciated, of course, that other types of operating systems and interfaces may be alternatively utilized. For example, rather than a traditional "Windows" system, other operation systems such as, for example, Linux may also be employed with respect to operating system 951 and interface 953. The software application 954 can include, for example, a simulation model generation module 952 for configuring a simulation model with respect to a particular process and/or system. Simulation model generation module 952 can include instructions, for example, such as those of methods 400, 700 and 800 discussed herein with respect to FIGS. 4, 7, and 8.

Note that programs defining functions with respect to the disclosed embodiments may be delivered to a data storage system or a computer system via a variety of signal-bearing media, which include, without limitation, non-writable storage media (e.g., CD-ROM), writable storage media (e.g., hard disk drive, read/write CD ROM, optical media), system memory such as, but not limited to, Random Access Memory (RAM), and communication media such as computer and telephone networks including, for example, Ethernet, the Internet, wireless networks, other networked systems. Thus, the methods 400, 700 and 800 described herein, for example, can be deployed in some embodiments as process software in the context of a computer system or data-processing system such as that depicted in FIGS. 9-10.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A method for configuring a model of a process, said method comprising:
   a processor;
   providing one or more component blocks, wherein each of the component blocks corresponds to a particular sub-model of the process and comprises one or more input variables and one or more output variables, wherein each input variable is associated with a process category and a search direction and each output variable is associated with a process category;
   arranging the one or more component blocks in a particular sequence to provide a process path corresponding to the model of the process;
   executing an automatic model configuration tool to:
     search starting from an input variable in the search direction associated with the input variable along the process path; and
     automatically assign a particular output variable to the input variable when the process category of the particular output variable matches the process category of the input variable.

2. The method of claim 1 further comprising:
   providing a same reference parameter to both the input variable and the particular output variable to connect them.

3. The method of claim 1:
   wherein each component block includes at least one inport connector and at least one outport connector, wherein said at least one inport connector and said at least one outport connector connect said component block in said particular sequence of said process.

4. The method of claim 1 further comprising:
   automatically creating an overall model readout by placing a readout block at a desired location in said particular sequence of said process.

5. The method of claim 4 further comprising:
   within said readout block, selecting a category of a readout signal to be read out; and
   relative to said readout block within said particular sequence of the process, assigning the closest output variable among output variables which has the same category as that of said selected readout signal to said overall model readout utilizing a reference parameter.

6. A system for configuring a model of a process, said system comprising:
   a processor;
   a data bus coupled to the processor; and
   a non-transitory computer-usable medium embodying computer code, said non-transitory computer-usable medium being coupled to said data bus, said computer program code comprising instructions executable by the processor and configured for:
   providing a model of a process that follows a particular sequence, said model comprising a plurality of component sub-models, wherein each component sub-model among said plurality of component sub-models comprises one or more input variables and one or more output variables and wherein each input variable is associated with a process category and a search direction and each output variable is associated with a process category;
   wherein the search direction defines a direction to search the process path for an output variable having the same process category as the input variable;
   executing an automatic model configuration tool to:
     search starting from an input variable in the search direction associated with the input variable along the process path; and
     automatically assign the input variable to a particular output variable when the process category associated with the input variable matches the process category associated with the particular output variable.

7. The system of claim 6 wherein said instructions are further configured for:
   providing a same reference parameter to both the input variable and the particular output variable to connect them.

8. The system of claim 6 wherein said instructions are further configured for:
   configuring each component sub-model among said plurality of component sub-models to be embedded in a component block with at least one inport connector and at least one outport connector, wherein said at least one inport connector and said at least one outport connector connect said component block in said particular sequence of the process.

9. The system of claim 6 wherein said instructions are further configured for:

automatically creating an overall model readout by placing a readout block at a desired location in said particular sequence of the process.

10. The system of claim 9 wherein said instructions are further configured for:

within said readout block, selecting a category of a readout signal to be readout out; and relative to said readout block within said particular sequence of the process, assigning the closest output variable among output variables which has the same category as that of said selected readout signal to said overall model readout utilizing a reference parameter.

11. A non-transitory computer-usable medium for configuring a model of a process, said non-transitory computer-usable medium embodying computer program code, said computer program code comprising computer executable instructions configured for:

providing a model of a process that follows a particular sequence, said model comprising a plurality of component sub-models, wherein each component sub-model among said plurality of component sub-models comprises one or more input variables and one or more output variables and wherein each input variable is associated with a process category and a search direction and each output variable is associated with a process category;

executing an automatic model configuration tool to:

search starting from an input variable in the search direction associated with the input variable along the process path; and automatically assign the input variable to a particular output variable when the process category associated with the particular input variable matches the process category associated with the particular output variable.

12. The computer-usable medium of claim 11 wherein said embodied computer program code further comprises computer executable instructions configured for:

providing a same reference parameter to both the input variable and the particular output variable to connect them.

13. The computer-usable medium of claim 11 wherein said embodied computer program code further comprises computer executable instructions configured for:

configuring each component sub-model among said plurality of component sub-models to be embedded in a component block with at least one inport connector and at least one outport connector, wherein said at least one inport connector and said at least one outport connector connect said component block in said particular sequence of the process.

14. The computer-usable medium of claim 11 wherein said embodied computer program code further comprises computer executable instructions configured for:

automatically creating an overall model readout by placing a readout block at a desired location in said particular sequence of the process.

* * * * *